(12) United States Patent
Rezeanu

(10) Patent No.: US 7,796,464 B1
(45) Date of Patent: Sep. 14, 2010

(54) SYNCHRONOUS MEMORY WITH A SHADOW-CYCLE COUNTER

(75) Inventor: Stefan-Cristian Rezeanu, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 1451 days.

(21) Appl. No.: 10/862,737

(22) Filed: Jun. 7, 2004

Related U.S. Application Data

(60) Provisional application No. 60/483,302, filed on Jun. 27, 2003.

(51) Int. Cl.
*G11C 8/18* (2006.01)

(52) U.S. Cl. .............................. 365/233.11; 365/233.12; 365/233.19

(58) Field of Classification Search .............. 365/233.1, 365/233.11, 233.12, 233.19
See application file for complete search history.

(56) References Cited

U.S. PATENT DOCUMENTS

| | | | |
|---|---|---|---|
| 4,750,149 A | 6/1988 | Miller | |
| 4,758,746 A | 7/1988 | Birkner et al. | |
| 4,852,049 A | 7/1989 | Sakai | |
| 4,878,200 A | 10/1989 | Asghar et al. | |
| 4,879,481 A | 11/1989 | Pathak et al. | |
| 4,942,318 A | 7/1990 | Kawana | |
| 4,963,770 A | 10/1990 | Keida | |
| 5,023,484 A | 6/1991 | Pathak et al. | |
| 5,027,011 A | 6/1991 | Steele | |
| 5,053,646 A | 10/1991 | Higuchi | |
| 5,073,873 A | 12/1991 | Kazutaka | |
| 5,136,188 A | 8/1992 | Ha et al. | |
| 5,144,582 A | 9/1992 | Steele | |
| 5,175,819 A | 12/1992 | Le Ngoc et al. | |
| 5,185,706 A | 2/1993 | Agrawal et al. | |
| 5,220,213 A | 6/1993 | Chan et al. | |
| 5,231,588 A | 7/1993 | Agrawal et al. | |
| 5,280,202 A | 1/1994 | Chan et al. | |
| 5,282,164 A | 1/1994 | Kawana | |

(Continued)

FOREIGN PATENT DOCUMENTS

EP 0199134 A2 10/1986

OTHER PUBLICATIONS

U.S. Appl. No. 09/966,838: "Method and Apparatus for Mask and/or Counter Address Registers Readback on the Address Bus in Synchronous Single and Multi-Port Memories," Stefan-Cristian Rezeanu; 44 pages.

(Continued)

*Primary Examiner*—Richard Elms
*Assistant Examiner*—Hien N Nguyen

(57) ABSTRACT

A synchronous memory with a shadow-cycle counter has a counter logic combiner with an address input, a registered processed-address input, an incremented-processed-address input, and a counter control input with an output that contains a processed address. A mask, counter, and mirror registers receives the processed address and has a clock input strobing around a middle of a pre-array clock cycle. An output of the mask, counter, and mirror registers forms a registered internal processed address. A clock phase shifter has a clock input and has an output coupled to the mask, counter, and mirror registers. A plane internal processed-address is coupled to the read/write control logic. An address output enable generated in the counter logic combiner is coupled to the data output enable logic.

13 Claims, 2 Drawing Sheets

U.S. PATENT DOCUMENTS

| | | | |
|---|---|---|---|
| 5,302,866 A | 4/1994 | Chiang et al. | |
| 5,309,046 A | 5/1994 | Steele | |
| 5,329,460 A | 7/1994 | Agrawal et al. | |
| 5,357,153 A | 10/1994 | Chiang et al. | |
| 5,384,745 A | 1/1995 | Konishi et al. | |
| 5,422,823 A | 6/1995 | Agrawal et al. | |
| 5,426,378 A | 6/1995 | Ong | |
| 5,451,887 A | 9/1995 | El Ayat et al. | |
| 5,455,525 A | 10/1995 | Ho et al. | |
| 5,521,529 A | 5/1996 | Agrawal et al. | |
| 5,537,057 A | 7/1996 | Leong et al. | |
| 5,548,786 A | 8/1996 | Amini et al. | |
| 5,550,782 A | 8/1996 | Cliff et al. | |
| 5,587,945 A | 12/1996 | Lin et al. | |
| 5,590,287 A | 12/1996 | Zeller et al. | |
| 5,594,365 A | 1/1997 | Agrawal et al. | |
| 5,594,366 A | 1/1997 | Khong | |
| 5,619,670 A | 4/1997 | Shindo | |
| 5,631,577 A | 5/1997 | Freidin et al. | |
| 5,638,008 A | 6/1997 | Rangasayee et al. | |
| 5,646,901 A | 7/1997 | Sharpe-Geisler et al. | |
| 5,791,030 A | 8/1998 | Agrawal et al. | |
| 5,799,176 A | 8/1998 | Kapusta et al. | |
| 5,811,987 A | 9/1998 | Ashmore, Jr. et al. | |
| 5,818,254 A | 10/1998 | Agrawal et al. | |
| 5,829,051 A | 10/1998 | Steely et al. | |
| 5,832,290 A | 11/1998 | Gostin et al. | |
| 5,848,285 A | 12/1998 | Kapusta et al. | |
| 5,850,368 A | 12/1998 | Ong et al. | |
| 5,966,027 A | 10/1999 | Kapusta et al. | |
| 5,977,791 A | 11/1999 | Veenstra | |
| 6,003,128 A * | 12/1999 | Tran | 712/241 |
| 6,044,412 A | 3/2000 | Evoy | |
| 6,049,223 A | 4/2000 | Lytle et al. | |
| 6,058,452 A | 5/2000 | Rangasayee et al. | |
| 6,097,211 A | 8/2000 | Couts-Martin et al. | |
| 6,134,181 A | 10/2000 | Landry | |
| 6,137,308 A | 10/2000 | Nayak | |
| 6,166,989 A | 12/2000 | Hamamoto et al. | |
| 6,167,487 A * | 12/2000 | Camacho et al. | 711/131 |
| 6,170,034 B1 | 1/2001 | Weston-Lewis et al. | |
| 6,175,514 B1 | 1/2001 | Henderson et al. | |
| 6,175,534 B1 | 1/2001 | Taniguchi et al. | |
| 6,191,998 B1 | 2/2001 | Reddy et al. | |
| 6,201,407 B1 | 3/2001 | Kapusta et al. | |
| 6,230,250 B1 * | 5/2001 | Vogley | 711/218 |
| 6,388,464 B1 | 5/2002 | Lacey et al. | |
| 6,490,206 B2 * | 12/2002 | Kwon et al. | 365/189.05 |
| 6,510,483 B1 | 1/2003 | Rezeanu et al. | |
| 6,570,866 B1 | 5/2003 | Murase et al. | |
| 6,782,467 B1 | 8/2004 | Rezeanu | |
| 6,789,180 B1 | 9/2004 | Rezeanu | |
| 6,807,645 B2 * | 10/2004 | Angelotti et al. | 714/732 |
| 7,206,979 B1 * | 4/2007 | Zarrineh et al. | 714/718 |
| 7,345,950 B2 * | 3/2008 | Fujisawa et al. | 365/233.12 |

OTHER PUBLICATIONS

U.S. Appl. No. 09/895,114: "Method and Apparatus for Fast Limited Core Area Access and Cross-Port Word Size Multiplication in Synchronous Multiport Memories," Stefan-Cristian Rezeanu; 31 pages.
USPTO Notice of Allowance for U.S. Appl. No. 09/895,114 dated Apr. 30, 2004; 3 pages.
USPTO Non-Final Rejection for U.S. Appl. No. 09/895,114 dated Dec. 15, 2003; 5 pages.
USPTO Notice of Allowance for U.S. Appl. No. 09/966,838 dated May 4, 2004; 5 pages.
USPTO Non-Final Rejection for U.S. Appl. No. 09/966,838 dated Dec. 24, 2003; 6 pages.
U.S. Appl. No. 09/531,365: "Circuit, Architecture and Method for Reading an Address Counter and/or Matching a Bus Width Through One or More Synchronous Ports," Rezeanu et al., filed on Mar. 21, 2000; 31 pages.
"3.3V 64K x 18 Synchronous QuadPort Static RAM," Cypress Preliminary CY7C0430BV, Cypress Semiconductor Corporation, Mar. 27, 2001; 36 pages.
"3.3V 16K/32K x 36 FLEx36 Asynchronous Dual-Port Static RAM," Cypress Preliminary CY7C056V/CY7C057V, Cypress Semiconductor Corporation, Nov. 22, 2000; 22 pages.
"Understanding The FLEx36 Dual-Port SRAMs," Cypress Semiconductor Corporation, Oct. 21, 1999; 9 pages.
USPTO Notice of Allowance for U.S. Appl. No. 09/531,365 dated Sep. 9, 2002; 3 pages.
USPTO Notice of Allowance for U.S. Appl. No. 09/475,808 dated Nov. 6, 2001; 3 pages.
USPTO Non-Final Rejection for U.S. Appl. No. 09/475,808 dated Jun. 6, 2001; 6 pages.
USPTO Notice of Allowance for U.S. Appl. No. 10/024,093 dated Sep. 10, 2002; 3 pages.
U.S. Appl. No. 09/475,879: "Programmable Logic Device," Lacey et al., filed on Dec. 30, 1999; 50 pages.
USPTO Notice of Allowance for U.S. Appl. No. 09/475,879 dated Oct. 22, 2004; 7 pages.
USPTO Advisory Action for U.S. Appl. No.09/475,879 dated Mar. 4, 2002; 3 pages.
USPTO Advisory Action for U.S. Appl. No.09/475,879 dated Dec. 31, 2001; 3 pages.
USPTO Final Rejection for U.S. Appl. No. 09/475,879 dated Oct. 11, 2001; 10 pages.
USPTO Non-Final Rejection for U.S. Appl. No. 09/475,879 dated Mar. 8, 2001; 6 pages.
USPTO Notice of Allowance for U.S. Appl. No. 09/690,294 dated Apr. 17, 2001; 3 pages.
USPTO Non-Final Rejection for U.S. Appl. No. 09/690,294 dated Dec. 19, 2000; 4 pages.
USPTO Notice of Allowance for U.S. Appl. No. 09/257,468 dated May 24, 2000; 3 pages.
USPTO Final Rejection for U.S. Appl. No. 09/257,468 dated Mar. 14, 2000; 5 pages.
USPTO Non-Final Rejection for U.S. Appl. No. 09/257,468 dated Nov. 2, 1999; 4 pages.
USPTO Notice of Allowance for U.S. Appl. No. 08/578,094 dated Jun. 25, 1998; 1 page.
USPTO Final Rejection for U.S. Appl. No. 08/578,094 dated Apr. 10, 1998; 4 pages.
USPTO Non-Final Rejection for U.S. Appl. No. 08/578,094 dated Oct. 8, 1997; 4 pages.
USPTO Notice of Allowance for U.S. Appl. No. 09/009,569 dated Mar. 21, 2000; 3 pages.
USPTO Non-Final Rejection for U.S. Appl. No. 09/009,569 dated Nov. 16, 1999; 7 pages.
USPTO Non-Final Rejection for U.S. Appl. No. 09/009,569 dated Jun. 18, 1999; 7 pages.
USPTO Notice of Allowance for U.S. Appl. No. 08/578,478 dated Sep. 22, 1997; 1 page.
USPTO Non-Final Rejection for U.S. Appl. No. 08/578,478 dated Jun. 24, 1997; 3 pages.
USPTO Final Rejection for U.S. Appl. No. 08/946,030 dated Mar. 6, 2000; 4 pages.
USPTO Non-Final Rejection for U.S. Appl. No. 08/946,030 dated Nov. 12, 1999; 3 pages.
USPTO Advisory Action for U.S. Appl. No. 08/946,030 dated Oct. 4, 1999; 1 page.
USPTO Final Rejection for U.S. Appl. No. 08/946,030 dated Jul. 19, 1999; 5 pages.
USPTO Non-Final Rejection for U.S. Appl. No. 08/946,030 dated Mar. 31, 1999; 4 pages.
USPTO Notice of Allowance for U.S. Appl. No. 08/940,437 dated Feb. 17, 1999; 2 pages.
Xilinx, "XC4000 Series Field Programmable Gate Arrays," Product Specification, Version 1.04, Sep. 18, 1996; pp. 4-5 through 4-180; 145 pages.

AMD, The MACH5-256, Fifth Generation MACH Architecture, Preliminary, Publication #20796, Issued Jan. 1997, Rev. C, pp. 1-40; 40 pages.

Altera Corporation, "MAX 9000 Programmable Logic Device Family," Data Sheet, Version 4, Jun. 1996, pp. 157-191; 35 pages.

Altera Corporation, "MAX 9000 Programmable Logic Device Family," Errata Sheet, Version 2.1, Nov. 1995, pp. 1; 1 page.

Altera Corporation, "FLEX 10K Embedded Programmable Logic Family," Data Sheet, Version 2, Jun. 1996, pp. 29-88; 60 pages.

Xilinx, "XC9500 In-System Programmable CPLD Family," Product Information, Version 1.1, May 1997, pp. 3-1 through 3-12; 12 pages.

USPTO Final Rejection for U.S. Appl. No. 09/357,716 dated Mar. 9, 2000; 4 pages.

USPTO Non-Final Rejection for U.S. Appl. No. 09/357,716 dated Oct. 18, 1999; 3 pages.

* cited by examiner

SYNCHRONOUS MEMORY WITH A SHADOW-CYCLE COUNTER

RELATED APPLICATIONS

The present invention claims priority on provisional patent application Ser. No. 60/483,302, filed on Jun. 27, 2003, entitled "Synchronous Memory with a Shadow-Cycle Counter" and assigned to the same assignee as the present invention.

FIELD OF THE INVENTION

The present invention relates generally to the field of memory circuits and more particularly to a synchronous memory with a shadow-cycle counter.

BACKGROUND OF THE INVENTION

The speed that a memory can be accessed either for writing or reading is critical to many electronic applications. Memory speed can be increased by increasing the clock speed of the memory system which, in the case of a multi-stage pipelined synchronous memory, generally translates to improving the actual memory array access cycle, called "array cycle" throughout the rest of the document. The array cycle is usually the limiting factor in increasing the memory's speed, even when multiple pipeline stages are used. Increasing the memory speed results in tighter internal operation windows, which in turn increase the likelihood of race conditions that often cause write/read failures. Limited efforts have been made to decrease the array cycle time for memories. There have been efforts to first predecode the address and then latch or register the predecoded address. However, these efforts do not comprehensively process the external address before decoding the internal address signal. They only capture the full external address and do not take into account counter control signals that determine the information stored in the counter, mask, mirror, and read-back latches/registers. In addition, the prior art does not have internal enable control signals—generated in the counter block—that control either the array address, the array read/write, or the activation/deactivation (i.e., the high/low impedance state) of the data and/or address outputs.

Thus, there exists a need for a synchronous memory with a shadow-cycle counter that improves memory cycle time and provides other important memory control capabilities.

SUMMARY OF INVENTION

A synchronous memory with a shadow-cycle counter that overcomes these and other problems has a counter logic combiner with an address input, a registered processed-address input, an incremented-processed-address input, and a counter control input with an output that contains a processed address. A mask, counter, and mirror registers receives the processed address and has a clock input strobing around a middle of a pre-array clock cycle. An output of the mask, counter, and mirror registers forms a registered internal processed address. A clock phase shifter has a clock input and has an output coupled to the mask, counter, and mirror registers. The clock phase shifter is a controllable phase shifter. A second clock phase shifter is coupled to the clock phase shifter. An array control circuit is coupled to the second clock phase shifter. A predecoder is coupled to the registered internal processed-address. The predecoder has a disable signal that is strobed around an end of a third quartile of the pre-array clock cycle.

A predecoded address flip flop is coupled to the predecoder and is strobed around an end of the pre-array clock cycle. A read-back address logic is coupled to the mask, counter, and mirror registers.

In one embodiment, a method of operating a synchronous memory with a shadow-cycle counter that includes the step of generating a processed address from an external address and an old registered address at a beginning of a pre-array clock cycle. A new registered address is determined at around a middle of the pre-array clock cycle. The new registered address is predecoded to form a predecoded address. The predecoded address may be registered at an end of the pre-array clock cycle. A plane address from the processed address may be used to deactivate a portion of a drive circuitry of a memory array. A disable signal is activated at a predecoder around a third quartile of the pre-array clock cycle. A clock signal may be delayed for around one half a clock period to from a first delayed clock. The first delayed clock may be delayed by around one quarter the clock period to form a second delayed clock.

In one embodiment, a synchronous memory with a shadow-cycle counter has a clock phase shifter with a first shifted clock output. A mask, counter, and mirror register is clocked by the first shifted clock output and forms a registered internal processed-address. The first shifted clock is delayed about one-half a pre-array clock cycle. A predecoder is coupled to the registered internal processed-address. A second clock phase shifter has an output that strobes an output of the predecoder disable logic. A counter logic combiner has an external address input, a registered processed-address input, an incremented-processed-address and a counter control input. The counter logic combiner has an output that contains a processed address that forms an input to the mask, counter, and mirror register. The mask, counter, and mirror register have a plane address as an output coupled to a read/write control logic. The counter logic combiner has an address output enable as an output coupled to a data output enable register.

DETAILED DESCRIPTION OF THE DRAWINGS

Figure 1:
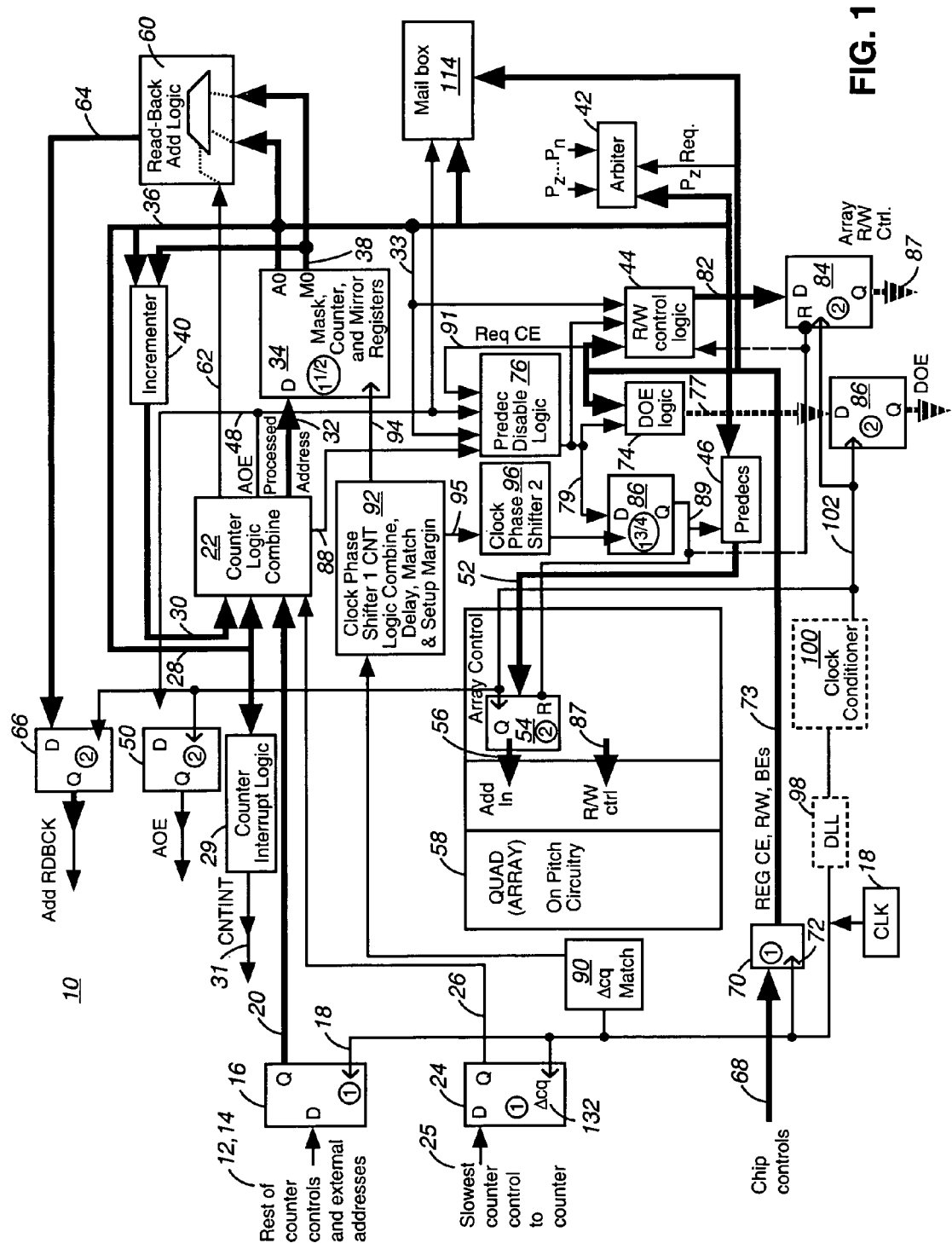
FIG. 1 is a partial block diagram of a synchronous memory with a shadow-cycle counter in accordance with one embodiment of the invention.

A partial block diagram of a synchronous memory 10 with a shadow-cycle counter in accordance with one embodiment of the invention is shown in FIG. 1. The external address 12 and all but the slowest counter control signals 14 are coupled to a D-flip flop 16. A clock signal 18 is also coupled to the D-flip flop 16. The output 20 of the D-flip flop 16 is coupled to a counter logic combiner 22. A second D-flip flop 24, having as an input the slowest counter control signal 25 to the counter control logic combiner 22 controls a second counter control signal 26. The clock signal 18 is also coupled to the second D-flip flop 24. The output 26 of the second D flip flop 24 is coupled to the counter logic combiner 22. The counter logic combiner 22 also receives the "old" (current cycle's) registered internal processed-address 28 and the incremented registered internal processed-address 30. The output 32 of the counter logic combiner 22 is the processed-address 32. The processed-address 32 is presented to the mask, counter, and mirror registers 34. The registered processed address 36 and mask 38 are coupled to the incrementer 40 and the address read-back logic 60. The registered addresses 36 are driving the arbiter 42 and predecoder 46. The address 36 contains plane and/or hexadecant address(es) 33 that are coupled to the predecoder disable logic 76 and the read/write control logic 44. It should be noted that the addresses 36 and 28 are essentially the same but the terminology of "new" and "old" address is used in order to stress the existent feedback loop. The registered address 36 are also coupled to the counter interrupt logic block 29 that generates the counter interrupt flag 31, which is generally registered at the beginning of the array-cycle. The counter logic combiner 22 has an address output enable (AOE) signal 48 controlled by the mask read and counter read signals, coupled to an AOE flip flop 50. The output 52 of the predecoder 46 is coupled to the predecoded address flip flops 54. The output of the predecoded address flip flops 54 are coupled to the address input 56 of the memory core 58. In one embodiment, the memory core 58 is a quarter (quad) of the array. The read-back logic circuit 60 is controlled by a read-back control signal 62 from the counter logic combiner 22. The output 64 of the read-back logic circuit 60 is coupled to an address read-back flip flop 66.

The chip control signals 68 are coupled to a control flip flop 70. The control flip flop 70 has a clock input 72 coupled to the clock signal 18. The output 73 of the control flip flop 70 includes the registered CE (Chip Enable) 91 which is coupled to the predecoder disable logic 76. The DOE logic 74 has an output 76 coupled to the flip flops 80, usually one flip flop per byte, controlling the active/tristate condition of the corresponding data outputs. This allows the memory circuit to tristate the output drive amplifiers when they are not in use. This reduces the current consumption of the memory circuit. The read/write control logic 44 also has an input coupled to the predecoder disable logic 76. The read/write control logic 44 in one embodiment has another input coupled to the output of the flip flop 86. This is represented by the dashed lines. The output 82 of the read/write control logic 44 is coupled to the read/write flip flops 84. The output of the read/write flip flop 84 is coupled to the read/write control input 87 of the memory core 58. The output 79 of the predecoder disable logic 76 is coupled to a predecoder disable control flip flop 86, the DOE logic 74, and the read/write control logic 44. The output 89 of the predecoder control flip flop 86 is coupled to the asynchronous control (e.g., reset) of the predecoder address flip flops 54. In one embodiment, the output of the predecoder disable control flip flop 86 is not coupled to asynchronous control of the predecoded address flip flops 54, but indirectly to their D inputs through the predecoders 46. This is represented by the dashed line. Similarly, the output 89 of the predecoder disable control flip flop 86 can either be coupled to the asynchronous controls of the read/write flip flops 84, or indirectly to their D input through the read/write control logic 44 (represented by dashed lines). The inputs to the predecoder disable logic control 76 include the address output enable (AOE) 48, a signal 88 indicating a cycle with information vehiculation only between the inputs and the counter, mask, mirror or read-back registers 34 (e.g., mask load internal signal MKLDi), the registered chip control signals (e.g., chip enable) 91, and the plane address(es) 33.

The clock 18 is coupled through a first matched delay cell 90 to a first clock phase shifter 92. The cells 90 and 92 are matching the delay to the counter, of the slowest counter control signal through the flip flop 24 and counter logic combiner 22 plus a setup margin. The output 94 of the first phase shifter 92 is used to clock the mask, counter, and mirror register 34 at approximately 1½ (meaning the middle of the pre-array clock cycle). An output 95 of the first phase shifter 92 is also coupled to a second clock phase shifter 96. The second clock phase shifter 96 creates an approximately ¼ clock cycle delay so that the predecoder disable control flip flop 86 is clocked at 1¾ clock cycles, meaning at the end of the third quartile of the pre-array cycle. In one embodiment, the clock 18 is coupled to a DLL (Delay Locked Loop) 98 (this is represented by the dashed lines) which is generally used to "advance" the clock 18. The output of the DLL 98 is coupled to a clock conditioner 100 with a variable delay (this is also shown in dashed lines). The output 102 of the clock conditioner 100 is coupled to the predecoded address flip flops 54, the address read-back flip flops 66, the AOE flip flop 50, the DOE flip flops 80 counter interrupt flag logic, and the array read/write control flip flops 84.

The counter logic combiner 22 logically combines the registered counter control and external address signals (26 and 20) with current cycle's registered internal processed-address 28, the incremented registered internal processed-address 30 and presents the processed internal address 32 to the mask, counter, and mirror registers 34. A phase shifted clock 94, with adjustable delay in one embodiment, is used to strobe the mask, counter, and mirror register at slightly less than 1½ clock cycles. The new cycle's, registered, internal processed-address 36 is presented to the predecoders 46, the arbitration circuit 42, the mailbox interrupt processing circuit 114, the read-back (multiplexed with mask) logic circuit 60, and the counter interrupt (flag) logic block 29. The plane address(es) component 33 of the processed-address 36 is presented to the read/write control logic circuit 44 as well as the predecoder disable logic block 76. In addition to the internal processed plane address(es), the read/write control logic block 44 is driven by the chip control signals and a logic combined signal generated by the predecoder disable logic block 76. The output 79 of the predecoder disable logic 76 is strobed by a phase delayed clock on the register 86 at 1¾ clock cycles. This is about one quartile of a clock cycle before the start of the array cycle. Another conditioned clock 102 strobes the predecoded address flip flops 54 at 2 clock cycles, meaning the beginning of the array cycle. As a result, the circuit does not have to decode the internal address during the array cycle. This significantly reduces the duration of the array cycle. In addition, the particular clocking of the predecoder disable control flip flop 86 allows the address predecoder flip flops 54 and/or read/write flip flops 84 to be disabled/enabled before the array cycle starts.

The internal address 36 being generated on the shadow-cycle, allows the counter interrupt logic 29 to detect the counter wrap-around condition and generate the counter interrupt (CNTINT) flag 31 that will be registered and provided to the user at the beginning of the array cycle.

Figure 2:
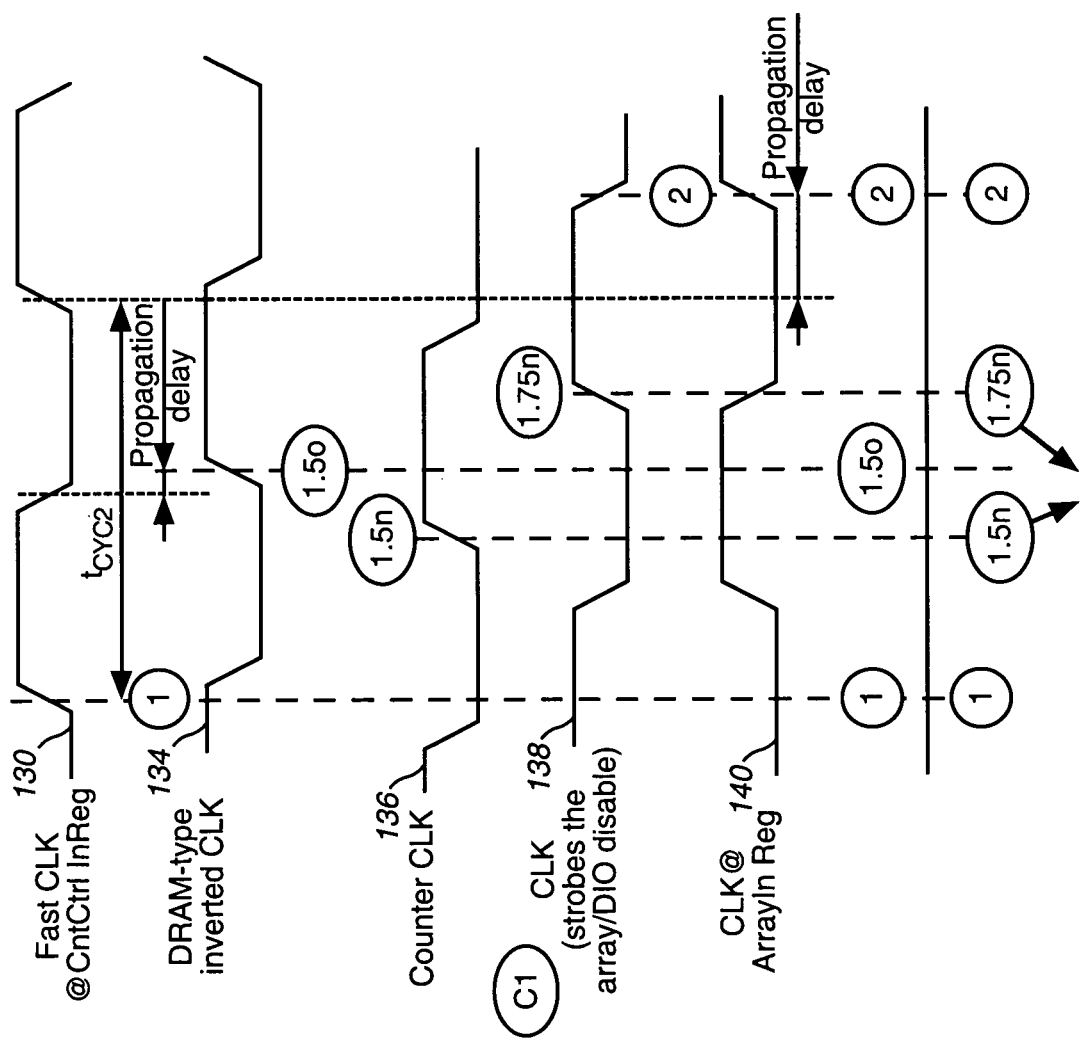
FIG. 2 is a pre-array cycle clock sequencing timing diagram in accordance with one embodiment of the invention.

FIG. 2 is a pre-array cycle clock sequencing timing diagram in accordance with one embodiment of the invention. The top trace 130 represents the clock signal 18 at the first D flip flops: 24, 16, or 70. The propagation delay Acq 132 between the clock and output of the flip flop 24 is matched in block 90. The second trace 134 represents the previous style (inverted) clock 94 at the input of the mask, counter, and mirror registers of block 34. The third trace 136, entitled counter clock, is the output 94 from the first phase clock shifter 92. The next trace 138, labeled C1 clock, represents the output of the second clock phase shifter 96. The signal 95 generally precedes signal 94 by a buffer delay at a minimum. The last trace 140, labeled CLK at ArrayInReg, represents the output 102 of the clock conditioner 100. As can be seen (trace 136) the mask, counter, and mirror registers 34 are clocked slightly before the "geometrical" 1½ clock cycle. The predecoder disable control flip flop 86 (trace 138) is then clocked around the 1¾ clock cycle.

The designations "1.5o" and "1.5n" represent two alternative embodiments of the invention. The "o" stands for "old" and would replace the delay cell 90 and the first phase shifter 92 with an inverter. As can be seen from the figure the new embodiment pulls in the clock ahead of the old version. This allows the output of the second phase shifter 96 to be ahead of the "geometrical" 1¾ clock cycle. This, coupled with the use of a DLL 98 that would advance the clock 102, which starts the array cycle, makes the memory cycle time faster by internally expanding the actual array cycle duration. Note that the arrows attached to some of the clocking circles indicate that these are loosely constrained time marks that may be optimized for maximum margins. The designation of the "1" in a circle means the start of the pre-array cycle, the "1.5" in a circle means about the middle of the pre-array cycle, the "1.75" in a circle means about the end of the third quartile of the pre-array cycle and the "2" in a circle means the end of the pre-array cycle and beginning of the array cycle.

Thus, there has been described a memory system that requires fewer clock cycles to perform a memory operation by performing the address predecoding 46 in the pre-array cycle and starting the array cycle earlier, to give it more time. In addition, the memory system allows the enabling/disabling of the pulsed core addresses and the read/write controls signals inputs of the memory array, as well as the tristate control of the data outputs by the counter control signals, including the ones that indicate data vehiculation only between the inputs of the mask, counter, and mirror registers 34. The counter interrupt flag is now made available to the user at the beginning of the array cycle, due to the generation of the registered address 36 with the shadow-cycle technique.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

What is claimed is:

1. A synchronous memory with a shadow-cycle counter, comprising:
    a counter logic combiner having an address input, a registered processed-address input, an incremented-processed-address input, and a counter control input having an output that contains a processed address;
    a mask, counter, a mirror registers receiving the processed address, having a clock input strobing around a middle of a pre-array clock cycle, an output forming a registered internal processed address; and
    a clock phase shifter having a clock input and having an output coupled to the mask, counter, and mirror registers.

2. The memory of claim 1, wherein the clock phase shifter is a controllable phase shifter.

3. The memory of claim 1, further including:
    a second clock phase shifter coupled to the clock phase shifter;
    an array control circuit coupled to the second clock phase shifter.

4. The memory of claim 3, further including a predecoder coupled to the registered internal processed-address.

5. The memory of claim 4, wherein the predecoder has a disable signal that is strobed around an end of a third quartile of the pre-array clock cycle.

6. The memory of claim 5, further including a predecoded address flip flop that is coupled to the predecoder and is strobed around an end of the pre-array clock cycle.

7. The memory of claim 1, further including a read-back address logic coupled to the mask, counter, and mirror registers.

8. A synchronous memory with a shadow-cycle counter, comprising:
    a clock phase shifter having a first shifted clock output; and
    a mask, counter, and mirror register clocked by the first shifted clock output and forming a registered internal processed-address, wherein the first shifted clock output is delayed about one half of a pre-array clock cycle.

9. The memory of claim 8, further including a predecoder coupled to the registered internal processed-address.

10. The memory of claim 9, further including a second clock phase shifter having an output that strobes an output of the predecoder.

11. The memory of claim 8, further including a counter logic combiner having an external address input, a registered processed-address input, an incremented-processed-address and a counter control input, the counter logic combiner having an output that contains a processed address that forms an input to the mask, counter, and mirror register.

12. The memory of claim 11, wherein the mask, counter, and mirror register have a plane address as an output coupled to a read/write control logic.

13. The memory of claim 11, wherein the counter logic combiner has an address output enable as an output coupled to a data output enable register.

* * * * *